(12) United States Patent
Yang

(10) Patent No.: US 7,631,687 B2
(45) Date of Patent: Dec. 15, 2009

(54) HEAT EXCHANGER

(75) Inventor: Ta-Jung Yang, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 231 days.

(21) Appl. No.: 11/422,566

(22) Filed: Jun. 6, 2006

(65) Prior Publication Data

US 2007/0169920 A1    Jul. 26, 2007

(30) Foreign Application Priority Data

Jan. 24, 2006    (TW) .............................. 95102705 A

(51) Int. Cl.
*H05K 7/20* (2006.01)
(52) U.S. Cl. .............. 165/104.33; 165/104.34; 361/700
(58) Field of Classification Search ............ 165/104.33, 165/104.34; 361/700
See application file for complete search history.

(56) References Cited

U.S. PATENT DOCUMENTS

| | | | | |
|---|---|---|---|---|
| 3,807,493 A | * | 4/1974 | Stewart ................. | 165/104.33 |
| 4,333,520 A | * | 6/1982 | Yanadori et al. ............... | 165/59 |
| 4,449,579 A | * | 5/1984 | Miyazaki et al. ........ | 165/104.33 |
| 4,600,050 A | * | 7/1986 | Noren ..................... | 165/104.33 |
| 4,665,466 A | * | 5/1987 | Green ........................ | 361/700 |
| 4,706,739 A | * | 11/1987 | Noren ..................... | 165/104.33 |
| 5,806,583 A | * | 9/1998 | Suzuki et al. ........... | 165/104.33 |
| 2003/0094266 A1 | * | 5/2003 | Fritsch .................. | 165/104.34 |
| 2005/0061485 A1 | * | 3/2005 | Hirafuji et al. ......... | 165/104.33 |

FOREIGN PATENT DOCUMENTS

| | | | | |
|---|---|---|---|---|
| JP | 53021441 A | * | 2/1978 |
| JP | 01140944 A | * | 6/1989 |
| JP | 03030400 A | * | 2/1991 |
| JP | 05052490 A | * | 3/1993 |
| JP | 05087474 A | * | 4/1993 |

* cited by examiner

*Primary Examiner*—Leonard R Leo

(57) ABSTRACT

A heat exchanger of a sealed equipment cabinet includes a chassis, a heat-exchange module, a first fan and a second fan. The chassis includes a bottom plate having a plurality of first perforations. The heat-exchange module is disposed on the bottom plate, and defines first and second air flow channels at first and second sides of the bottom plate, respectively. The first fan is disposed on the first side of the bottom plate. The second fan is disposed on the second side of the bottom plate.

12 Claims, 7 Drawing Sheets

HEAT EXCHANGER

FIELD OF THE INVENTION

The present invention relates to a heat exchanger, and more particularly to a heat exchanger for removing heat accumulated inside a sealed equipment cabinet.

BACKGROUND OF THE INVENTION

Referring to FIG. 1, a schematic view of a conventional sealed equipment cabinet is illustrated. The sealed equipment cabinet 1 is employed for isolating the internal electronic components (not shown) from the adverse environmental conditions such as rain, humidity, dust and pollutants in order to extend the operational lives of the electronic components. As known, the internal electronic components may generate heat during operation, which is readily accumulated around the circuit board and difficult to dissipate away. If the sealed equipment cabinet 1 fails to transfer enough heat to the ambient air, the elevated operating temperature may result in damage of the electronic components, a breakdown of the whole sealed equipment cabinet 1 or reduced operation efficiency. For maintaining a normal working temperature, a heat exchanger 10 is provided on the back side of the sealed equipment cabinet 1 to remove most heat accumulated in the sealed equipment cabinet 1.

The heat exchanger 10 principally comprises an upper fan 11, a lower fan 12, a plurality of spaced heat sink fins 13, a partition plate 14, an external air inlet 15, an external air outlet 15', an internal air inlet 16, an internal air outlet 16' and a crooked heat pipe 17. The upper fan 11 and the lower fan 12 are in fluid communication with the ambient air and the inside portion of the sealed equipment cabinet 1, respectively. The partition plate 14 is extended from the inner wall of the heat exchanger 10 such that the heat exchanger 10 is partitioned into an upper receptacle 101 and a lower receptacle 102. The heat sink fins 13 have thereon several perforations (not shown). The crooked heat pipe 17, which contains cooling fluid therein, is penetrated through the perforations of the heat sink fins 13 and tightly bound to the fins 13.

The heat dissipation mechanism of the heat exchanger 10 will be illustrated as follows in more details.

First of all, the hot air H1 generated from the electronic components inside the sealed equipment cabinet 1 is pumped by the lower fan 12 to the lower receptacle 102 through the internal air inlet 16. The hot air H1 is then conducted to the heat sink fins 13 and the heat pipe 17, so that a portion of heat of the hot air H1 is transmitted to the upper receptacle 101 and a cooled air C1 is returned to the sealed equipment cabinet 1 through the internal air outlet 16'. At the same time, the ambient cooling air C2 is pumped by the upper fan 11 to the upper receptacle 101 through the external air inlet 15. The cooling air C2 is then conducted to the heat sink fins 13 and the heat pipe 17 to remove a further portion of heat from the heat sink fins 13 and the heat pipe 17. Meanwhile, a heated air H2 is exhausted to the surroundings through the external air outlet 15'.

Although the heat exchanger 10 shown in FIG. 1 may remove a portion of heat generated from the electronic components inside the sealed equipment cabinet 1, there are still some drawbacks. For example, if the heat exchanger 10 has been operated for an extended time period, the heat pipe 17 is likely ruptured and the cooling fluid contained therein will be leaked out. Under this circumstance, the overall heat exchange efficiency of the sealed equipment cabinet 1 is largely reduced. For increasing heat-dissipating efficiency, the combination of the heat pipe 17 and the heat sink fins 13 should be refreshed because the sealed equipment cabinet 1 has only one heat pipe 17. It is costly and time-consuming to refresh the combination of the heat pipe 17 and the heat sink fins 13.

Please refer to FIG. 1 again. Since the lower fan 12 is very close to the internal air inlet 16, the cooled air C1 is rapidly returned to the sealed equipment cabinet 1 through the internal air outlet 16' simultaneously after the hot air H1 is pumped by the lower fan 12 to the lower receptacle 102 through the internal air inlet 16. Under this circumstance, a portion of cooled air C1' is likely to reflow under the heat sink fins 13 and in the vicinity of the internal air inlet 16, in which the cooled air C1' is mixed with the hot air H1. The interference between the cooled air and the hot air may impair the heat exchange efficiency of the heat exchanger 10. Similarly, since the upper fan 11 is very close to the external air inlet 15, the heated air H2 is rapidly exhausted to the surroundings through the external air outlet 15' simultaneously after the cooling air C2 is pumped by the upper fan 11 to the upper receptacle 101 through the external air inlet 15. Under this circumstance, a portion of heated air H2' is likely to reflow above the heat sink fins 13 and in the vicinity of the external air inlet 15, in which the heated air H2' is mixed with the cooling air C2. The interference between the heated air and the cooling air may also impair the heat exchange efficiency of the heat exchanger 10.

Referring to FIG. 2, a schematic view of another conventional heat exchanger used in a sealed equipment cabinet is illustrated. The heat exchanger 20 is disposed at the top side of the sealed equipment cabinet 2. The heat exchanger 20 principally comprises an upper fan 21, a lower fan 22, a plurality of spaced heat sink fins 23, a top air inlet 25, a bottom air outlet 26 and a plurality of spaced heat pipe 27. The upper fan 21 and the lower fan 22 are in fluid communication with the ambient air and the inside portion of the sealed equipment cabinet 2, respectively. By the top surface of the sealed equipment cabinet 2, the heat exchanger 20 is partitioned into an upper receptacle 201 and a lower receptacle 202. The heat sink fins 23 have thereon several perforations (not shown). The heat pipes 27, which contain cooling fluids therein, are penetrated through the perforations of the heat sink fins 23 and tightly bound to the fins 23. In comparison with the heat exchanger 10 as shown in FIG. 1, the heat pipes 27 of the heat exchanger 20 shown in FIG. 2 are perpendicular to the heat sink fins 23. In addition, since more heat pipes 27 are used, the heat exchanger 20 may normally operate even if only a small number of heat pipes 27 are damaged. The heat dissipation mechanism of the heat exchanger 20 is similar to that described in the heat exchanger 10 of FIG. 1, and is not redundantly described herein.

Please refer to FIG. 2 again. Since the lower fan 22 is very close to the bottom air outlet 26, the cooled air C1 is rapidly returned to the sealed equipment cabinet 2 through the bottom air outlet 26 simultaneously after the hot air H1 is pumped by the lower fan 22 to the lower receptacle 202. Under this circumstance, a portion of cooled air C1' is likely to reflow under the heat sink fins 23 and in the vicinity of the bottom air outlet 26, in which the cooled air C1' is mixed with the hot air H1. The interference between the cooled air and the hot air may impair the heat exchange efficiency of the heat exchanger 20. Similarly, since the upper fan 21 is very close to the top air inlet 25, the heated air H2 is rapidly exhausted to the surroundings through the top air inlet 25 simultaneously after the cooling air C2 is pumped by the upper fan 21 to the upper receptacle 201. Under this circumstance, a portion of heated air H2' is likely to reflow above the heat sink fins 23 and in the vicinity of the upper fan 21, in which the heated air H2' is mixed with the cooling air C2. The interference between the heated air and the cooling air may also impair the heat exchange efficiency of the heat exchanger 20. For increasing the overall heat-dissipating efficiency of the heat exchanger 20, the area and the number of the heat sink fins 23 and the heat pipes 27 should be largely increased. Therefore, the whole volume of the heat exchanger is increased and a large layout space is needed.

In views of the above-described disadvantages resulted from the conventional method, the applicant keeps on carving unflaggingly to develop an improved heat exchanger according to the present invention through wholehearted experience and research.

SUMMARY OF THE INVENTION

An object of the present invention is to provide a heat exchanger for removing heat accumulated inside a sealed equipment cabinet in enhanced heat exchange efficiency without largely increasing the overall volume thereof, in which the interference between the heated air and the cooling air is minimized.

In accordance with an aspect of the present invention, there is provided a heat exchanger used in a sealed equipment cabinet. The heat exchanger comprises a chassis, a heat-exchange module, a first fan and a second fan. The chassis comprises a bottom plate having a plurality of first perforations. The heat-exchange module is disposed on the bottom plate, and defines first and second air flow channels at first and second sides of the bottom plate, respectively. The first fan is disposed on the first side of the bottom plate. The second fan is disposed on the second side of the bottom plate.

In an embodiment, the heat-exchange module comprises a plurality of spaced first heat sink fins, a plurality of spaced second heat sink fins and a plurality of heat pipes. The first heat sink fins are arranged on the first side of the bottom plate for cooperatively defining the first air flow channel and have second perforations corresponding to the first perforations. The second heat sink fins are arranged on the second side of the bottom plate for cooperatively defining the second air flow channel and have third perforations corresponding to the first perforations. The heat pipes are penetrated through the second perforations of the first heat sink fins, the first perforations of the bottom plate and the third perforations of the second heat sink fins, so that the first heat sink fins and the second heat sink fins are securely fixed onto the first and second sides of the bottom plate, respectively.

In an embodiment, the heat pipes are penetrated through the second perforations of the first heat sink fins, the first perforations of the bottom plate and the third perforations of the second heat sink fins by a press fit operation.

In an embodiment, the chassis is substantially a box with no lid.

In an embodiment, the chassis comprises the bottom plate and four lateral plates cooperatively formed as a receptacle at the second side of the bottom plate.

In an embodiment, the second fan and the second heat sink fins are accommodated within the receptacle of the chassis.

In an embodiment, the heat exchanger further comprises a first fixing plate protruded from an air outlet of the first fan.

In an embodiment, the heat exchanger further comprises first and second baffle plates, which are disposed on opposite sides of the topmost first heat sink fin.

In an embodiment, the heat exchanger further comprises a second fixing plate protruded from an air outlet of the second fan.

In an embodiment, the heat exchanger further comprises third and fourth baffle plates, which are disposed on opposite sides of the lowermost second heat sink fin.

In an embodiment, the first and second fixing plates have several fixing holes sheathed around adjacent heat pipes.

In an embodiment, the heat exchanger further comprises an external cover for sheltering the first fan, the first heat sink fins and the first side of the chassis.

In an embodiment, the first and second baffle plates are substantially in contact with the inner wall of the external cover.

In an embodiment, the third and fourth baffle plates are substantially in contact with a housing of the sealed equipment cabinet.

In an embodiment, the external cover further comprises at least one first vent hole and at least one second vent hole.

In an embodiment, the ambient cooling air is pumped by the first fan to successively flow through the first vent hole of the external cover, the first fan and the first air flow channel, so that a portion of heat accumulated on the heat-exchange module is removed by the ambient cooling air and the heated air is vented through the second vent hole of the external cover.

In an embodiment, the hot air inside the sealed equipment cabinet is pumped by the second fan to flow through the second flow channel, so that a portion of heat contained in the hot air is conducted to the heat-exchange module and a cooled air is returned to the sealed equipment cabinet.

In accordance with another aspect of the present invention, there is provided a heat exchanger used in a sealed equipment cabinet. The heat exchanger comprises a chassis, a heat-exchange module, a first fan, a second fan and an external cover. The chassis comprises a bottom plate having a plurality of first perforations. The heat-exchange module is disposed on the bottom plate, and defines first and second air flow channels at first and second sides of the bottom plate, respectively. The first fan is disposed on the first side of the bottom plate. The second fan is disposed on the second side of the bottom plate. The external cover is used for sheltering the first fan, the first heat sink fins and the first side of the chassis. The external cover further comprises at least one first vent hole and at least one second vent hole. The ambient cooling air is pumped by the first fan to successively flow through the first vent hole of the external cover, the first fan and the first air flow channel, so that a portion of heat accumulated on the heat-exchange module is removed by the ambient cooling air and the heated air is vented through the second vent hole of the external cover. The hot air inside the sealed equipment cabinet is pumped by the second fan to flow through the second flow channel, so that a portion of heat contained in the hot air is conducted to the heat-exchange module and a cooled air is returned to the sealed equipment cabinet.

In accordance with another aspect of the present invention, there is provided a heat exchanging system used in a sealed equipment cabinet. The heat exchanging system comprises a plurality of heat exchangers electrically connected in parallel. Each of the heat exchangers comprises a chassis comprising a bottom plate having a plurality of first perforations; a heat-exchange module disposed on the bottom plate, and defining first and second air flow channels at first and second sides of the bottom plate, respectively; a first fan disposed on the first side of the bottom plate; and a second fan disposed on the second side of the bottom plate.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
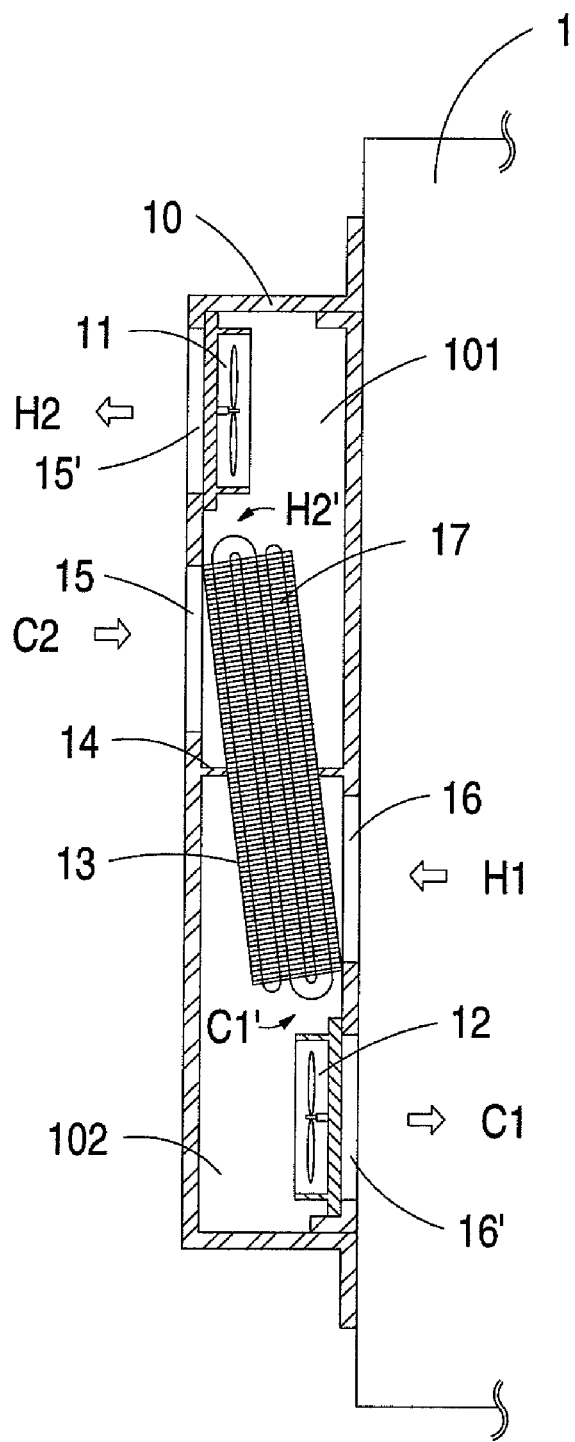
FIG. 1 is a schematic view illustrating a conventional heat exchanger used in a sealed equipment cabinet.
Figure 2:
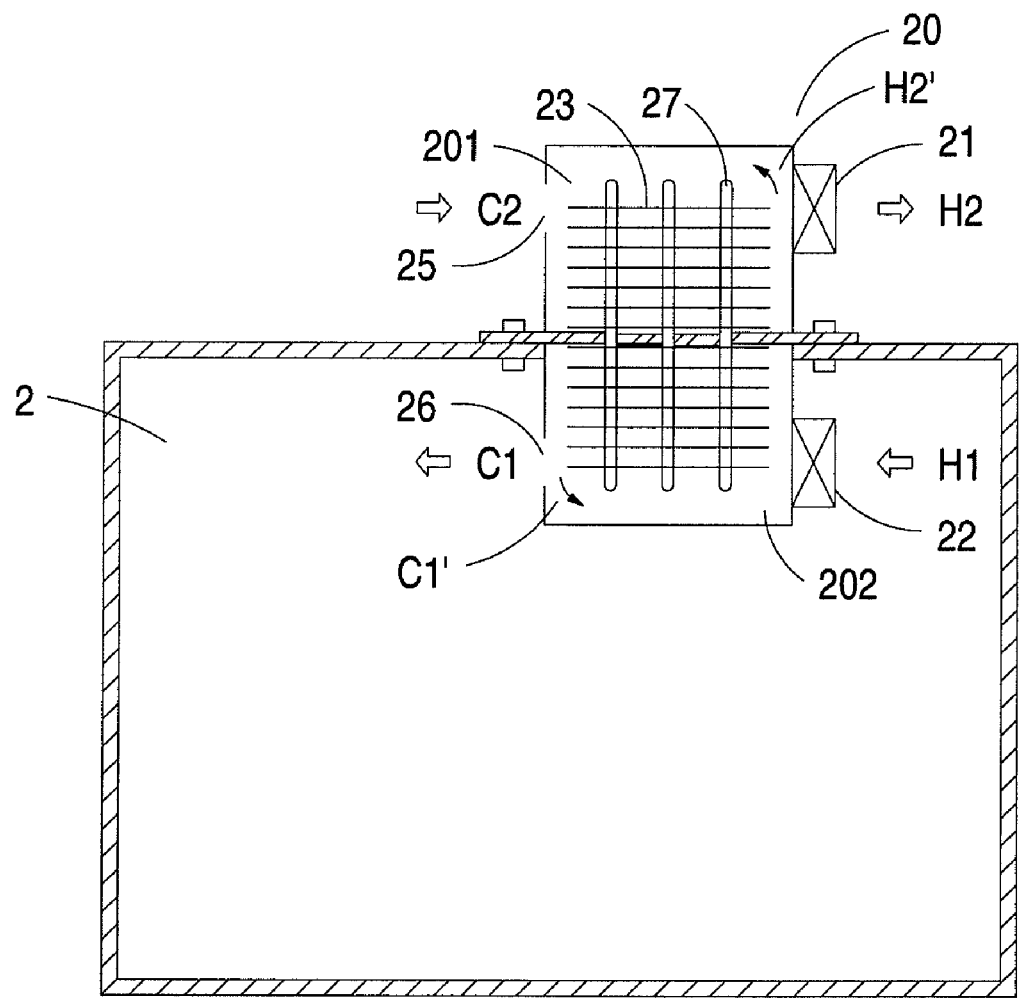
FIG. 2 is a schematic view illustrating another conventional heat exchanger used in a sealed equipment cabinet.
Figure 3:
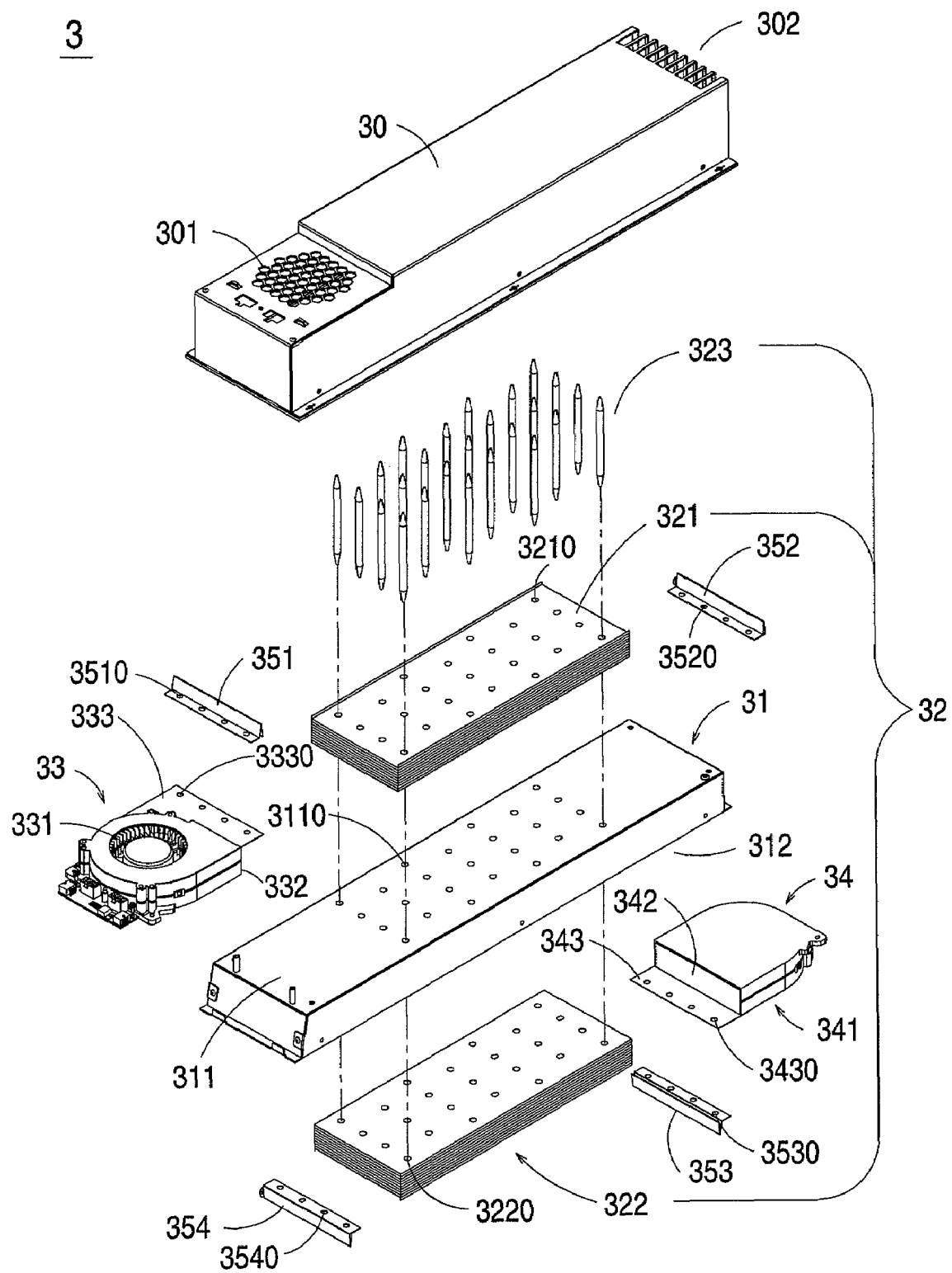
FIG. 3 is a schematic exploded view illustrating a heat exchanger used in a sealed equipment cabinet according to a preferred embodiment of the present invention.

Referring to FIG. 3, a schematic exploded view of a heat exchanger used in a sealed equipment cabinet according to a preferred embodiment of the present invention is illustrated. The heat exchanger 3 of FIG. 3 principally comprises an external cover 30, a chassis 31, a heat-exchange module 32, a first fan 33, a second fan 34 and several baffle plates 351~354. Several vent holes 301 and 302 are provided at bilateral sides of the external cover 30, respectively. The chassis 31 is substantially a box with no lid, and comprises a bottom plate 311 and a receptacle 312. The bottom plate 311 of the chassis 31 has a plurality of perforations 3110 therein. The heat-exchange module 32 comprises a plurality of spaced first heat sink fins 321, a plurality of spaced second heat sink fins 322 and a plurality of heat pipe 323. The first heat sink fins 321 and the second heat sink fins 322 also have perforations 3210 and 3220 corresponding to the perforations 3110 of the bottom plate 311 of the chassis 31. The heat pipes 323 contain cooling fluids therein. Furthermore, a fixing plate 333 including several fixing holes 3330 is protruded from an upper edge of the air outlet 332 of the first fan 33.

Please refer to FIGS. 4(A), 4(B), 4(C) and 4(D), which schematically illustrate the process of assembling the heat exchanger according to a preferred embodiment of the present invention.

Figure 4A:
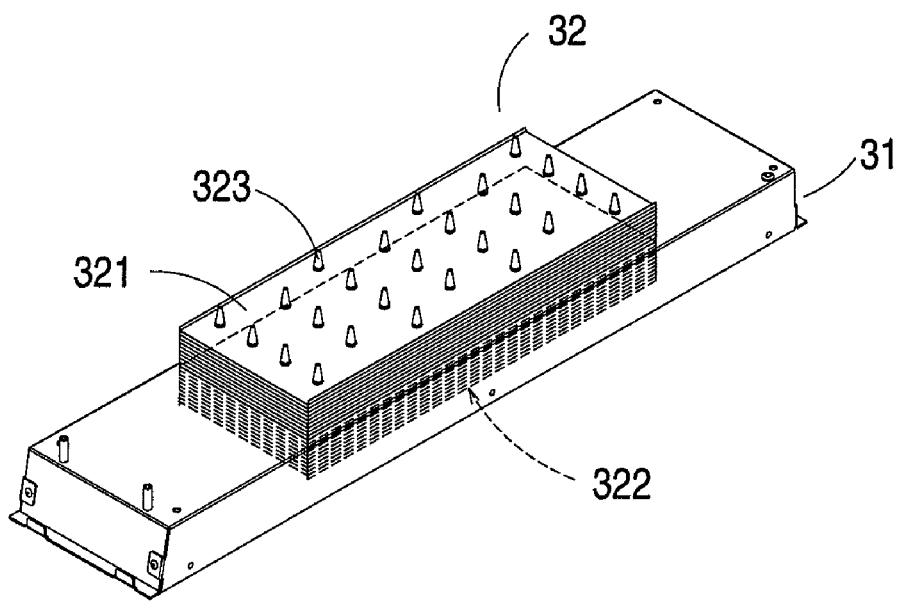
FIGS. 4(A), 4(B), 4(C) and 4(D) are schematic views illustrating the process of assembling the heat exchanger of the present invention.

First of all, as shown in FIG. 4(A), by a press fit operation, the heat pipes 323 are successively penetrated through the perforations 3210 of the first heat sink fins 321, the perforations 3110 of the bottom plate 311 and the perforations 3220 of the second heat sink fins 322. Accordingly, the first heat sink fins 321 and the second heat sink fins 322 are securely fixed on the bottom plate 311 and within the receptacle 312, respectively.

Figure 4B:
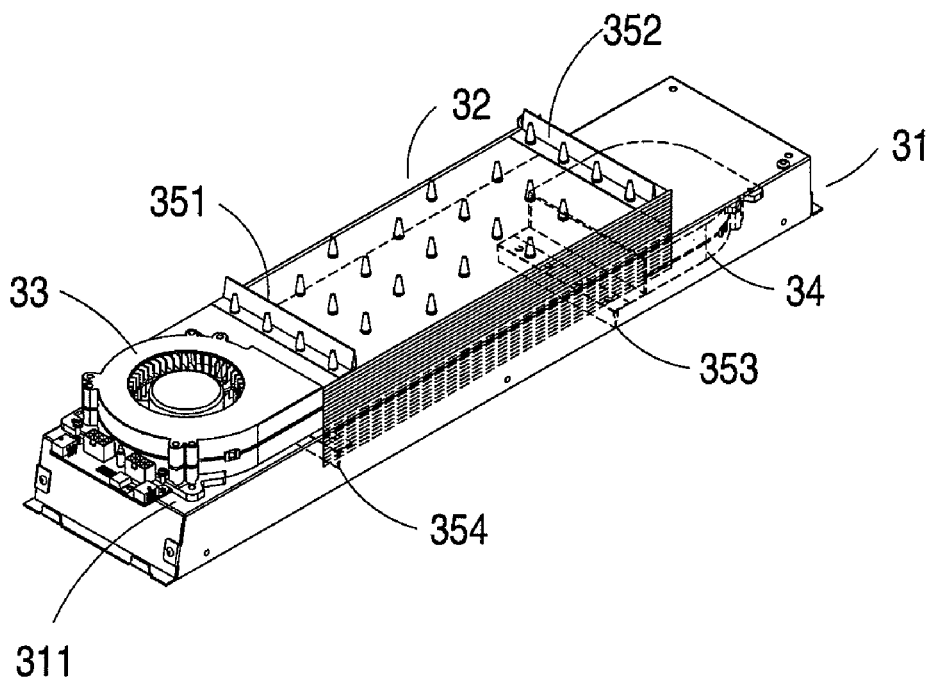

Please refer to FIGS. 3 and 4(B). The baffle plate 351 has several fixing holes 3510 corresponding to the fixing holes 3330 of the fixing plate 333. Similarly, another fixing plate 343 including several fixing holes 3430 is protruded from an upper edge of the air outlet 342 of the second fan 34. The baffle plate 353 has several fixing holes 3530 corresponding to the fixing holes 3430 of the fixing plate 343. The baffle plates 352 and 354 also have fixing holes 3520 and 3540, respectively.

Subsequently, as shown in FIG. 4(B), the first fan 33 is disposed on the bottom plate 311 of the chassis 31, in which the air inlet 331 of the first fan 33 is located at the upward side thereof, the air outlet 332 is faced to the air flow channel defined by the spaced first heat sink fins 321, and the fixing holes 3330 of the fixing plate 333 are sheathed around the nearest heat pipes 323. Likewise, the second fan 34 is disposed within the receptacle 312 of the chassis 31, in which the air inlet 341 of the second fan 34 is located at the downward side thereof, the air outlet 342 is faced to the air flow channel defined by the spaced second heat sink fins 322, and the fixing holes 3430 of the fixing plate 343 are sheathed around the nearest heat pipes 323. Then, the fixing holes 3510 and 3520 of the baffle plates 351 and 352 are sheathed around the nearest heat pipes 323 on opposite sides of the topmost first heat sink fin 321, respectively, so that the baffle plates 351 and 352 are fixed onto the heat pipes 323. Likewise, the fixing holes 3530 and 3540 of the baffle plates 353 and 354 are sheathed around the nearest heat pipes 323 on opposite sides of the lowermost second heat sink fin 322, respectively, so that the baffle plates 353 and 354 are fixed onto the heat pipes 323.

Figure 4C:
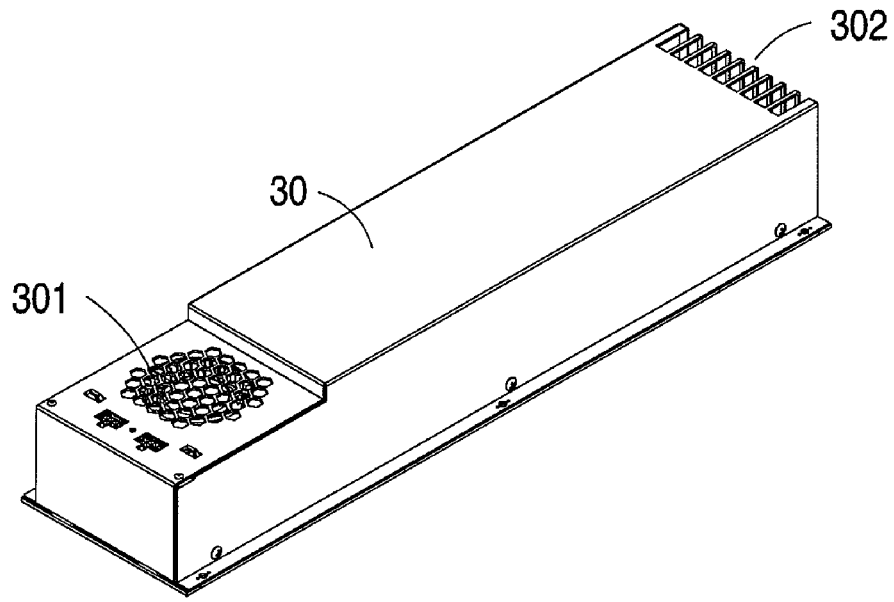
Figure 4D:
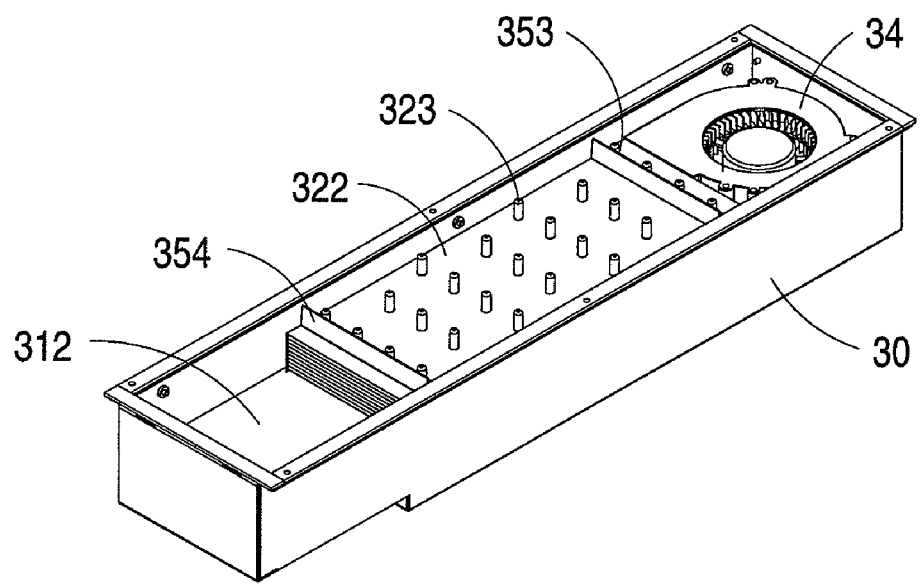

After the external cover 30 is placed on the resulting structure, the heat exchanger 3 of the present invention is assembled accordingly. The top and rear views of the assembled heat exchanger 3 are shown in FIGS. 4(C) and 4(D), respectively.

Figure 5:
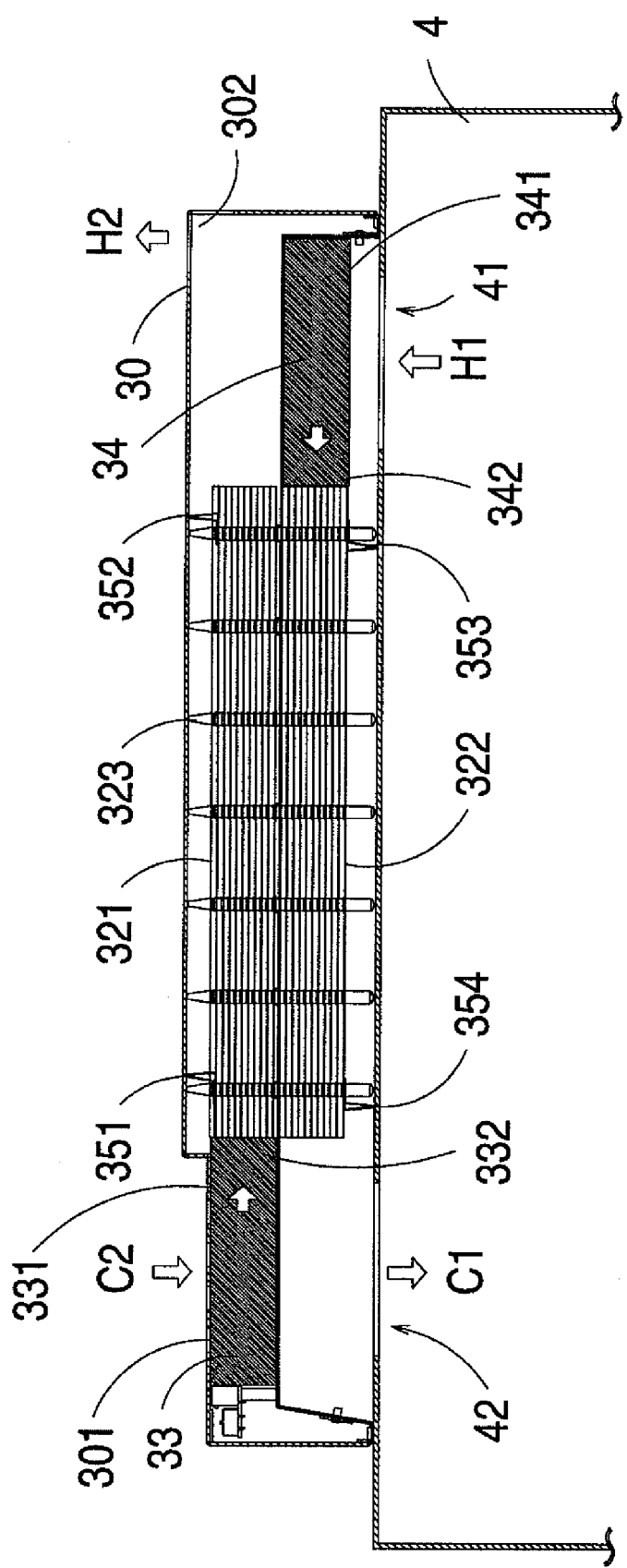
FIG. 5 is a schematic cross-sectional view illustrating a heat exchanger of the present invention.

The heat dissipation mechanism of the heat exchanger 3 will be illustrated with reference to FIG. 5 in more details.

First of all, the hot air H1 generated from the electronic components (not shown) inside the sealed equipment cabinet 4 is pumped by the second fan 34, so that the hot air H1 are successively pumped through an internal air inlet 41 at the housing of the sealed equipment cabinet 4, the air inlet 341 of the second fan 34, the air outlet 342 of the second fan 34 and the air flow channel defined by the spaced second heat sink fins 322. The hot air H1 is then conducted to the second heat sink fins 322 and the heat pipes 323, so that a portion of heat of the hot air H1 is transmitted to the first heat sink fins 321 via the heat pipes 323 and a cooled air C1 is returned to the sealed equipment cabinet 4 through the internal air outlet 42. At the same time, the ambient cooling air C2 is pumped by the first fan 33, so that the cooling air C2 is successively pumped through the vent holes 301, the air inlet 331 of the first fan 33, the air outlet 332 of the first fan 33 and the air flow channel defined by the spaced first heat sink fins 321. The cooling air C2 is then conducted to the first heat sink fins 321 and the heat pipes 323 to remove a further portion of heat from the first heat sink fins 321 and the heat pipes 323. Meanwhile, a heated air H2 is exhausted to the surroundings through the vent holes 302.

Figure 6:
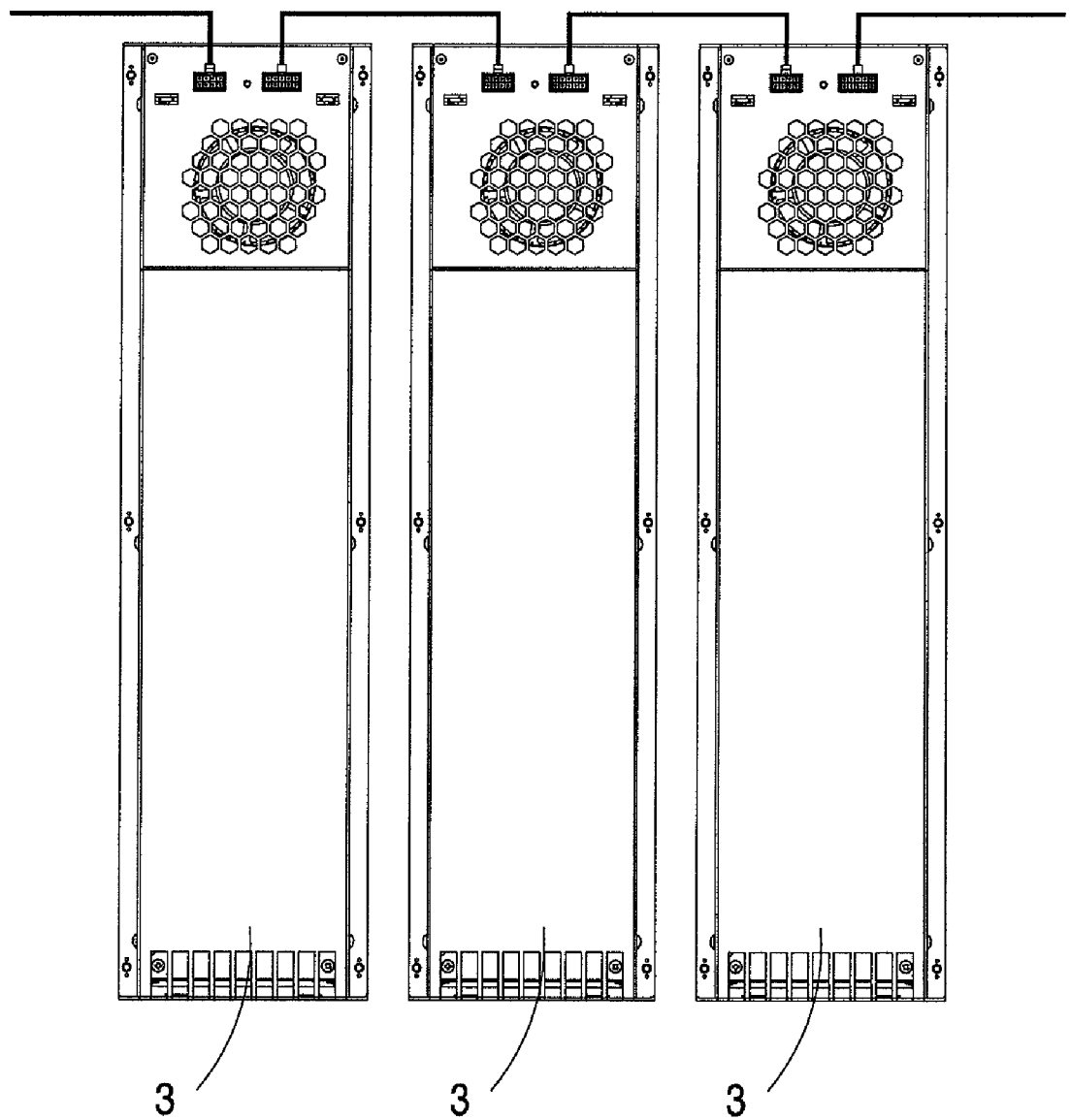
FIG. 6 is a schematic view illustrating several heat exchangers are used in a sealed equipment cabinet in parallel connection.

Furthermore, the tips of the baffle plates 351 and 352 are very close or in contact with the inner wall or the external cover 30 and the tips of the baffle plates 353 and 354 are very close or in contact with the housing of the sealed equipment cabinet 4. As a consequence, the heat exchange efficiency of the heat exchanger 30 is enhanced because the interference between the heated air and the cooling air or between the hot air and the cooled air is minimized or avoided Referring to FIG. 6, an implantation example of the heat exchanger is illustrated. As shown in FIG. 6, more than two heat exchangers 3 are used in a sealed equipment cabinet in order to increase the heat-exchanging effectiveness. Every two adjacent heat exchangers 3 are connected in parallel connection. If either of the heat exchangers 3 has a breakdown, the other heat exchangers 3 may continuously operate to remove heat accumulated in the sealed equipment cabinet.

Optionally, the fans 33 and 34 may be selected from variable-speed fans, which can be operated with variable heat-dissipating power from 0% to 100%. In a preferred embodiment, each of the heat exchangers 3 in parallel connection is operated with partial heat-dissipating power, i.e. greater than 0% and less than 100%, and operated with full heat-dissipating power if any heat exchanger 3 has a breakdown.

In the above embodiments, the external cover 30 and the chassis 31 are made of the materials having high thermal conductivities, for example aluminum alloys. The first heat sink fins 321 and the second heat sink fins 322 are also made of the materials having high thermal conductivities, for example copper or aluminum. Examples of the first fan 33 and the second fans are blowers. Since the heat pipes 323 are independent from each other, the heat exchanger 3 may still function well if only a small number of heat pipes 323 are damaged. According to the space utilization, the heat exchanger of the present invention can be arranged at any location inside or outside the sealed equipment cabinet. For example, the heat exchanger can be arranged on the top surface, the lateral side, the back side or the door of the sealed equipment cabinet.

From the above description, the heat exchanger of the present invention is capable of removing heat accumulated inside a sealed equipment cabinet in enhanced heat exchange efficiency because the interference between the heated air and the cooling air is minimized or avoided. In addition, since this heat exchanger is made slim, the space utility thereof is enhanced even if the heat exchanger is disposed inside the sealed equipment cabinet.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A heat exchanger used in a sealed equipment cabinet, said heat exchanger comprising:
    a chassis comprising a bottom plate having a plurality of first perforations;
    a heat-exchange module comprising a plurality of spaced first heat sink fins arranged on first side of said bottom plate for cooperatively defining a first air flow channel and having second perforations corresponding to said first perforations, a plurality of spaced second heat sink fins arranged on second side of said bottom plate for cooperatively defining a second air flow channel and having third perforations corresponding to said first perforations, and a plurality of heat pipes penetrated through said second perforations of said first heat sink fins, said first perforations of said bottom plate and said third perforations of said second heat sink fins by a press fit operation, so that said first heat sink fins and said second heat sink fins are securely fixed onto said first and second sides of said bottom plate, respectively;
    first and second baffle plates disposed on opposite sides of the topmost first heat sink fin;
    third and fourth baffle plates disposed on opposite sides of the lowermost second heat sink fin;
    a first fan disposed on said first side of said bottom plate;
    a second fan disposed on second side of said bottom plate; and
    a first fixing plate and a second fixing plate respectively protruded from an air outlet of said first fan and an air outlet of said second fan, said first and second fixing plates having several fixing holes sheathed around adjacent heat pipes;
    wherein said first baffle plate is adjacent to said first fan and substantially disposed between said first fan and said second baffle plate.

2. The heat exchanger according to claim 1 wherein said chassis is substantially a box with no lid.

3. The heat exchanger according to claim 2 wherein said chassis comprises said bottom plate and four lateral plates cooperatively formed as a receptacle at said second side of said bottom plate.

4. The heat exchanger according to claim 3 wherein said second fan and said second heat sink fins are accommodated within said receptacle of said chassis.

5. The heat exchanger according to claim 1 further comprising an external cover for sheltering said first fan, said first heat sink fins and said first side of said chassis.

6. The heat exchanger according to claim 5 wherein said first and second baffle plates are substantially in contact with the inner wall of said external cover.

7. The heat exchanger according to claim 5 wherein said third and fourth baffle plates are substantially in contact with a housing of said sealed equipment cabinet.

8. The heat exchanger according to claim 5 wherein said external cover further comprises at least one first vent hole and at least one second vent hole.

9. The heat exchanger according to claim 8 wherein the ambient cooling air is pumped by said first fan to successively flow through said first vent hole of said external cover, said first fan and said first air flow channel, so that a portion of heat accumulated on said heat-exchange module is removed by the ambient cooling air and the heated air is vented through said second vent hole of said external cover.

10. The heat exchanger according to claim 8 wherein the hot air inside said sealed equipment cabinet is pumped by said second fan to flow through said second flow channel, so that a portion of heat contained in said hot air is conducted to said heat-exchange module and a cooled air is returned to said sealed equipment cabinet.

11. A heat exchanger used in a sealed equipment cabinet, said heat exchanger comprising:
    a chassis comprising a bottom plate having a plurality of first perforations;
    a heat-exchange module comprising a plurality of spaced first heat sink fins arranged on first side of said bottom plate for cooperatively defining a first air flow channel and having second perforations corresponding to said first perforations, a plurality of spaced second heat sink fins arranged on second side of said bottom plate for cooperatively defining a second air flow channel and having third perforations corresponding to said first perforations, and a plurality of heat pipes penetrated through said second perforations of said first heat sink fins, said first perforations of said bottom plate and said third perforations of said second heat sink fins by a press fit operation, so that said first heat sink fins and said second heat sink fins are securely fixed onto said first and second sides of said bottom plate, respectively;
    first and second baffle plates disposed on opposite sides of the topmost first heat sink fin;
    third and fourth baffle plates disposed on opposite sides of the lowermost second heat sink fin;
    a first fan disposed on said first side of said bottom plate;

a second fan disposed on said second side of said bottom plate;

a first fixing plate and a second fixing plate respectively protruded from an air outlet of said first fan and an air outlet of said second fan, said first and second fixing plates having several fixing holes sheathed around adjacent heat pipes; and an external cover for sheltering said first fan, said first heat sink fins and said first side of said chassis, said external cover further comprising at least one first vent hole and at least one second vent hole, wherein said first baffle plate is adjacent to said first fan and substantially disposed between said first fan and said second baffle plate, the ambient cooling air is pumped by said first fan to successively flow through said first vent hole of said external cover, said first fan and said first air flow channel, so that a portion of heat accumulated on said heat-exchange module is removed by the ambient cooling air and the heated air is vented through said second vent hole of said external cover, and the hot air inside said sealed equipment cabinet is pumped by said second fan to flow through said second flow channel, so that a portion of heat contained in said hot air is conducted to said heat-exchange module and a cooled air is returned to said sealed equipment cabinet.

12. A heat exchanging system used in a sealed equipment cabinet, comprising:

a plurality of heat exchangers electrically connected in parallel, wherein each of said heat exchangers comprises:

a chassis comprising a bottom plate having a plurality of first perforations;

a heat-exchange module comprising a plurality of spaced first heat sink fins arranged on first side of said bottom plate for cooperatively defining a first air flow channel and having second perforations corresponding to said first perforations, a plurality of spaced second heat sink fins arranged on second side of said bottom plate for cooperatively defining a second air flow channel and having third perforations corresponding to said first perforations, and a plurality of heat pipes penetrated through said second perforations of said first heat sink fins, said first perforations of said bottom plate and said third perforations of said second heat sink fins by a press fit operation, so that said first heat sink fins and said second heat sink fins are securely fixed onto said first and second sides of said bottom plate, respectively;

first and second baffle plates disposed on opposite sides of the topmost first heat sink fin;

third and fourth baffle plates disposed on opposite sides of the lowermost second heat sink fin;

a first fan disposed on said first side of said bottom plate;

a second fan disposed on said second side of said bottom plate; and a first fixing plate and a second fixing plate respectively protruded from an air outlet of said first fan and an air outlet of said second fan, said first and second fixing plates having several fixing holes sheathed around adjacent heat pipes;

wherein said first baffle plate is adjacent to said first fan and substantially disposed between said first fan and said second baffle plate.

* * * * *

UNITED STATES PATENT AND TRADEMARK OFFICE
CERTIFICATE OF CORRECTION

PATENT NO. : 7,631,687 B2  Page 1 of 1
APPLICATION NO. : 11/422566
DATED : December 15, 2009
INVENTOR(S) : Ta-Jung Yang It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 423 days.

Signed and Sealed this

Second Day of November, 2010

David J. Kappos
*Director of the United States Patent and Trademark Office*